(12) United States Patent
Adan

(10) Patent No.: US 6,693,326 B2
(45) Date of Patent: Feb. 17, 2004

(54) SEMICONDUCTOR DEVICE OF SOI STRUCTURE

(75) Inventor: Alberto O. Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 38 days.

(21) Appl. No.: 09/822,251

(22) Filed: Apr. 2, 2001

(65) Prior Publication Data

US 2001/0028089 A1 Oct. 11, 2001

(30) Foreign Application Priority Data

Apr. 4, 2000 (JP) ........................................ 2000-102359

(51) Int. Cl.⁷ .............................................. H01L 27/01
(52) U.S. Cl. ........................ 257/347; 257/347; 257/348; 257/349; 257/359; 257/376; 257/387
(58) Field of Search ................................. 257/347, 348, 257/349, 359, 376, 387

(56) References Cited

U.S. PATENT DOCUMENTS

| | | | |
|---|---|---|---|
| 4,484,209 A | 11/1984 | Uchida | |
| 5,527,724 A | 6/1996 | Brady et al. | |
| 5,578,865 A | 11/1996 | Vu et al. | |
| 5,920,093 A | 7/1999 | Huang et al. | |
| 5,973,364 A | 10/1999 | Kawanaka | |
| 6,064,090 A * | 5/2000 | Miyamoto et al. | 257/347 |
| 6,173,235 B1 * | 1/2001 | Maeda | 702/58 |
| 6,249,027 B1 * | 6/2001 | Burr | 257/350 |
| 6,268,630 B1 * | 7/2001 | Schwank et al. | 257/347 |
| 6,288,425 B1 * | 9/2001 | Adan | 257/347 |
| 6,291,859 B1 * | 9/2001 | Litwin et al. | 257/368 |

FOREIGN PATENT DOCUMENTS

| | | |
|---|---|---|
| FR | 2 496 342 A | 6/1982 |
| JP | 61-43475 | 3/1986 |
| JP | 62-13376 | 1/1987 |
| JP | 3-30371 | 2/1991 |
| JP | 5-218425 | 8/1993 |
| JP | 8-8431 | 1/1996 |
| WO | 93/08603 | 4/1993 |

OTHER PUBLICATIONS

Duyet et al., "Effects of Body Reverse Pulse Bias on Geometric Component of Charge Pumping Current in FD SOI MOSFETS", Annual IEEE International Silicon–on–Insulator Conference, U.S. New York, NY, IEEE, vol. Conf. 24, Oct. 5, 1998, pp. 79–80.

Tseng et al., AC Floating–Body Effects in Submicron Fully Depleted (FD) SOI nMOSFETS and the Impact on Analog Applications, IEEE Electron Device Letters, U.S>, IEEE Inc., New York, vol. 19, No. 9, Sep. 1, 1998, pp. 351–353.

Patent Abstract of Japan, vol. 010, No. 133 (E–404), May 17, 1986 & JP 60 263 466 A (Kogyo Gijutsuin; Others: OJ), Dec. 26, 1985.

* cited by examiner

*Primary Examiner*—Tom Thomas
*Assistant Examiner*—Edgardo Ortiz
(74) *Attorney, Agent, or Firm*—Nixon & Vanderhye P.C.

(57) ABSTRACT

A semiconductor device of SOI structure comprises a surface semiconductor layer in a floating state, which is stacked on a buried insulating film so as to construct an SOI substrate, source/drain regions of second conductivity type which are formed in the surface semiconductor layer, a channel region of first conductivity type between the source/drain regions and a gate electrode formed on the channel region through a gate insulating film; wherein the surface semiconductor layer has a potential well of the first conductivity type formed therein at and/or near at least one end of the channel region in a gate width direction thereof.

15 Claims, 9 Drawing Sheets

SEMICONDUCTOR DEVICE OF SOI STRUCTURE

CROSS-REFERENCE TO RELATED APPLICATION

This application is related to Japanese application No. 2000-102359 filed on Apr. 4, 2000, whose priority is claimed under 35 USC §119, the disclosure of which is incorporated by reference in its entirety.

BACKGROUND OF THE INVENTION

1. Field of the Invention

This invention relates to a semiconductor device having an SOI structure, and more particularly to a semiconductor device of SOI structure in which a "kink effect" is reduced.

2. Description of the Related Art

A MOSFET fabricated on a generally known SOI substrate such as SOS, SIMOX or BSOI substrate, is capable of a low-voltage and high-speed operation. Besides, the SOI MOSFET has the advantage of realizing a smaller layout area, as compared with a device fabricated on a bulk silicon substrate.

Meanwhile, whereas a bulk silicon MOSFET has four terminals (gate, drain, source and substrate), the SOI MOSFET has only three terminals (gate, drain and source). Therefore, the SOI MOSFET deteriorates the electrical characteristics of a device, especially a short channel effect, a breakdown voltage between drain/source, etc.

More specifically, in the bulk silicon MOSFET, as shown in FIGS. 7(a) and 7(b), a parasitic bipolar (NPN) transistor has its base fixed to the substrate, and the substrate-source junction of the MOSFET is reverse biased. Therefore, even when an impact ionization current Ii is generated in the vicinity of the drain region of the MOSFET, the parasitic bipolar transistor hardly affects the operation of the MOSFET.

On the other hand, in the SOI MOSFET, as shown in FIGS. 8(a) and 8(b), a parasitic bipolar transistor has its base formed of a surface semiconductor layer in a floating state. In the ordinary operation of the MOSFET, therefore, an impact ionization current Ii generated in the vicinity of the drain region of the MOSFET acts as the base current of the parasitic bipolar transistor and gives rise to a positive feedback effect, with the result that the deterioration of a short channel effect and the reduction of a breakdown voltage between drain/source are brought about. Besides, in a case where the channel region of the MOSFET is formed as a comparatively thick surface semiconductor layer, the operation thereof becomes a partially depleted mode, and a so-called "kink effect" appears in the output characteristics thereof due to impact ionization, so that SOI MOSFET characteristics are drastically limited.

FIGS. 9(a) and 9(b) are graphs illustrative of the characteristics of the ordinary SOI MOSFET having the floating body, in which the relationships between a subthreshold current Id and a gate voltage Vg are shown in FIG. 9(a), while the relationships between an output current Id and a drain-source voltage Vd are shown in FIG. 9(b). By the way, the example of this SOI transistor had gate length L=0.35 $\mu$m, channel width W=10 $\mu$m, thickness of a gate oxide film=7 nm, thickness of a surface silicon body layer=50 nm and thickness of a buried insulating film=120 nm. Besides, in applications to LSIs driven by low voltages, a standby current limits the battery life of a portable system, and it is determined by the transistor current at Vg=0 V.

The kink effect ascribable to the impact ionization is observed for the drain voltage Vd>Vdk. In this case, the kink starting voltage Vdk is about 0.9 V.

Excess majority carriers (holes for an NMOSFET) ascribable to the impact ionization raise the potential of the floating body and cause the kink effect in the I–V characteristic.

The rise of the body potential decreases a threshold voltage, and it is observed as the decrease of a subthreshold swing (S factor) in the Id–Vg characteristic shown in FIG. 9(a). More specifically, S=85 mV/dec holds for Vd=0.1 V and S=35 mV/dec holds for Vd=1.5 V (Vd>Vdk). This is based on the accumulation of the excess majority carriers in the SOI substrate.

In general, the kink effect depends upon the impact ionization, the lifetime of carriers in the body, etc. and is therefore difficult of prediction and control. Moreover, the kink effect incurs the large fluctuations of device characteristics, especially an undesirable standby leakage current in a device of low-voltage operation.

In order to cope with the drawbacks, various methods have been proposed as exemplified below. It is the present situation, however, that any of the methods has not yet succeeded in efficiently preventing the kink effect without deteriorating the various characteristics of the SOI MOSFET.

(1) An SOI MOSFET is so constructed that a channel region is formed of a low-concentration of impurity and thin surface semiconductor layer which is fully depleted. Thus, the SOI MOSFET of full depletion mode can be obtained, and the kink effect can be theoretically prevented.

For the purpose of actually preventing the kink effect in the full depletion mode SOI MOSFET, it is necessary to set an impurity concentration considerably lower than $1 \times 10^{17}$ cm$^{-3}$ and a low threshold voltage of about 0.1 V, in the case of employing a surface semiconductor layer 50 nm thick by way of example. On this occasion, however, the OFF leakage current of the MOSFET increases.

(2) As shown in FIG. 10 by way of example, an SOI MOSFET is constructed on an active region 11 of constricted shape, and body contacts 13 are formed in the active region 11 (refer to the official gazette of Japanese Patent Application Laid-open No. 8431/1996). Thus, a channel region formed of a comparatively thick surface semiconductor layer can be held at a fixed potential, so that a floating body effect and a parasitic bipolar effect can be suppressed as in a device employing bulk silicon.

In the case of fixing the potential of the channel region, however, the occupation area of the body contacts 13 is required, resulting in an increased element area. Besides, in a case where the surface semiconductor layer has been fully depleted, the suppressions of the floating body effect and the parasitic bipolar effect are nullified. Further, when the potential of the channel region is fixed, a back-gate effect and a drain junction capacitance are increased to degrade the quality of a device.

(3) As shown in FIG. 11 by way of example, two SOI MOSFETs are connected in series so as to share a drain 14 in an electrically floating state (refer to the official gazette of Japanese Patent Application Laid-open No. 218425/1993).

It is difficult, however, to realize the SOI MOSFETs for a device which has a channel length of subhalfmicron order. For example, in a device having a gate length of 0.35 $\mu$m, the channel length d of each of P-type regions 15, 16 becomes about 0.1 $\mu$m. This length is substantially equal to a lateral diffusion length in an N+ impurity diffused layer. It is therefore extraordinarily difficult to control the impurity diffusion of the diffused layer. Moreover, when the channel length d is about 0.1 μm, a depletion layer region extending from the drain region 14 punchs through the whole channel region 16. It is therefore very difficult to control the characteristics of the device.

(4) As shown in FIG. 12, an SOI MOSFET is constructed using a surface silicon layer 20 made of single-crystal silicon of N-type, and its surface channel 21 is set with P-type (refer to the official gazette of Japanese Patent Application Laid-open No. 13376/1987). Owing to this structure, holes generated by impact ionization are recombined in the N-type surface silicon layer 20, so that a kink effect can be suppressed. Besides, a source-drain leakage current can be suppressed by fully depleting the surface silicon layer 20 in the OFF state of the MOSFET.

This structure, however, has the problems that a short channel effect and punchthrough are liable to occur, and that a subchannel leakage is caused by the short channel effect.

(5) As shown in FIG. 13, an SOI MOSFET is fabricated into a structure which has an N-type region 31 at a middle channel part in a surface silicon layer 30 (refer to the official gazette of Japanese Patent Application Laid-open No. 30371/1991). Thus, the withstand voltage of the MOSFET can be enhanced.

However, even when each of two channel regions 32, 33 separated by the N-type region 31 is formed as the minimum channel region, it requires a large layout area and incurs degradation in the current driving capability of the transistor.

(6) Further, as shown in FIG. 14, an SOI MOSFET is fabricated into a structure which has an impurity region 41 under a source 40 (refer to the official gazette of Japanese Patent Application Laid-open No. 43475/1986). Thus, the lifetime of carriers accumulated in a surface semiconductor layer 42 can be shortened, with the result that a kink effect can be suppressed.

With this structure, however, a process margin for forming the impurity region 41 in a very thin surface semiconductor layer (thinner than about 50 nm), which is required of, for example, a full depletion mode device having a gate length of 0.25 μm, is very narrow to incur the complication of a manufacturing process and the lowering of an available percentage.

SUMMARY OF THE INVENTION

The present invention has been made in view of the problems explained above, and has for its object to provide a semiconductor device of SOI structure which can suppress a kink effect arising in a surface semiconductor layer of floating state, without degrading the various characteristics mentioned above and without contradicting the microfabrication of the device.

According to the present invention, provided a semiconductor device of SOI structure comprises a surface semiconductor layer in a floating state, which is stacked on a buried insulating film so as to construct an SOI substrate, source/drain regions of second conductivity type which are formed in the surface semiconductor layer, a channel region of first conductivity type between the source/drain regions and a gate electrode formed on the channel region through a gate insulating film; wherein the surface semiconductor layer has a potential well of the first conductivity type formed therein at and/or near at least one end of the channel region in a gate width direction thereof.

DETAILED DESCRIPTION OF THE INVENTION

Figure 1A:
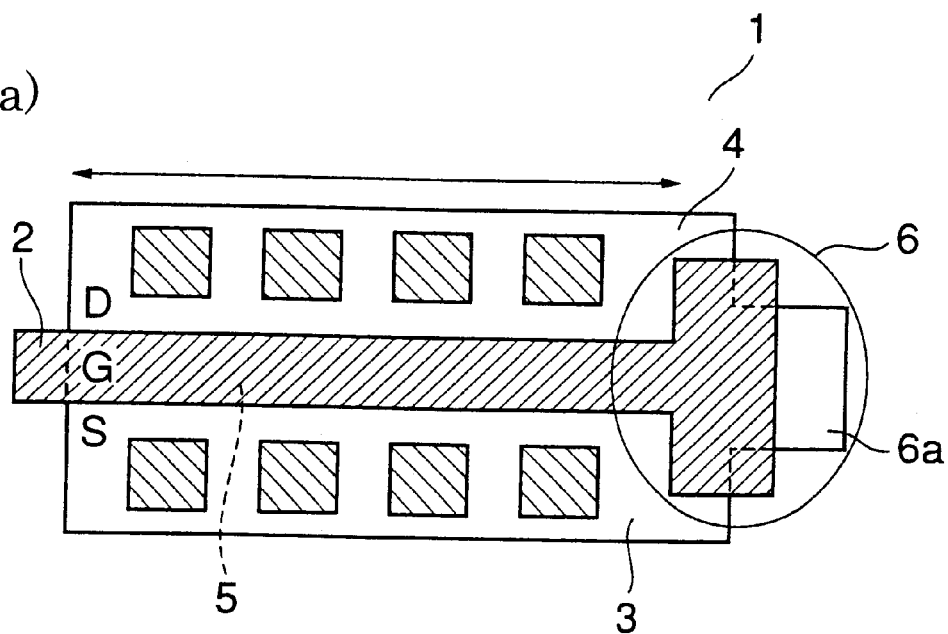
FIG. 1(*a*) is a schematic plan view of essential portions showing an embodiment of a semiconductor device of SOI structure according to the present invention, while FIG. 1(*b*) is a schematic model plan view of essential portions for explaining the operation thereof.

A semiconductor device of SOI structure according to the present invention is constructed mainly having source/drain regions which are formed in the surface semiconductor layer of an SOI substrate as is in a floating state, a gate electrode which is formed over a channel region arranged between the source/drain regions, and a potential well which is formed at and/or near at least one end of the channel region in the gate width direction thereof.

The SOI substrate in the present invention may be a substrate which is usually constructed by successively forming a buried insulating film and the surface semiconductor layer on a supporting substrate, and which is effective to realize a low power consumption and a high-speed operation. Mentioned as examples of the SOI substrate are an SOS substrate, a bonded SOI (BSOI) substrate, a SIMOX (Separation by Implantation of Oxygen) substrate and the like. Usable as the supporting substrate may be any of various substrates, for example, substrates of element semiconductors such as silicon and germanium, substrates of compound semiconductors such as GaAs and InGaAs, and substrates of insulators such as sapphire, quartz, glass and plastics. Incidentally, the supporting substrate in this case may be a supporting substrate on which elements such as transistors or capacitors, circuits or the likes are formed.

Mentioned as the buried insulating film is, for example, a single-layer film such as $SiO_2$ film or SiN film, or a multilayer film thereof. The thickness of the film may be appropriately adjusted in consideration of the characteristics of the semiconductor device to be fabricated, the magnitudes of applied voltages in the case of operating the fabricated semiconductor device, etc., and it may be about 50 nm to 500 nm by way of example.

The surface semiconductor layer may be a semiconductor thin film which functions as an active layer for forming a transistor, and it can be formed of a thin film made of an element semiconductor such as silicon or germanium, a compound semiconductor such as GaAs or InGaAs, or the like. Among all, the silicon thin film is favorable. The thickness of the surface semiconductor layer may be appropriately adjusted in consideration of the characteristics etc. of the semiconductor device to be fabricated, and in accordance with various parameters such as the junction depths of the source/drain regions of the transistor, the depth of the channel region in the surface of the surface semiconductor layer, and impurity concentrations. This thickness may be, for example, about 150 nm to 200 nm. Incidentally, the surface semiconductor layer may be formed with at least one high-concentration impurity diffused layer as a well. In the case where two or more wells are formed, or where a plurality of semiconductor devices are formed inside or outside the wells, the individual wells or the individual semiconductor devices may preferably be isolated by a LOCOS film or a trenched device isolation film.

The surface semiconductor layer includes therein the source/drain regions of second conductivity type, the channel region of first conductivity type arranged between the source/drain regions, and the potential well of the first conductivity type.

The source/drain regions of the second conductivity type may contain an impurity which has the conductivity type opposite to that of the surface semiconductor layer, and whose concentration may be, for example, about $1 \times 10^{20}$ to $1 \times 10^{21}$ atoms/cm$^3$. The source/drain regions may have regions of low concentration, such as of LDD structure or DDD structure, at the ends of the source/drain regions on the channel sides. Besides, the depths of the source/drain regions may preferably reach the buried oxide film for the reason that the vertical width of a depletion layer lowers the capacitances between the source/drain regions and the substrate.

The channel region of the first conductivity type is arranged between the source/drain regions, and it may properly be adjusted to an impurity concentration which controls the threshold voltage of the semiconductor device to an appropriate value, and which may be about $1 \times 10^{15}$ to $1 \times 10^{18}$ atoms/cm$^3$ by way of example.

The potential well of the first conductivity type may be formed at and/or near one end of the channel region in the gate width direction thereof (in a direction indicated by an arrow in FIG. 1(a)), or the potential wells may be formed at and/or near both the ends of the channel region. Here, the word "end" shall signify a region which adjoins the channel region and which lies just under the gate electrode. Also, the word "near" shall indicate a region which surrounds the end without including the end itself. Therefore, the potential well may have its whole region arranged under the gate electrode or only its partial region arranged similarly. Further, the whole region of the potential well need not be overlapped by the gate electrode. Although not especially restricted, a depth where the potential well lies may preferably be substantially the same depth as the thickness of the surface semiconductor layer, namely, the depth reaching the buried oxide film, in order to collect excess carriers.

The shape of the potential well in plan depends also upon the shape of the gate electrode, it may be any of a rectangle, a substantially rectangular shape, etc., or it may be any of a shape having a convex portion on a device isolation region side, etc. In any case, the potential well properly have, at least, a length Lpn (refer to FIG. 1(b)) which does not cause a short channel effect incurring a potential fall, in the gate length direction of the gate electrode, and it preferably be longer than the gate length L of the gate electrode. By way of example, the potential well may preferably be about 1.5 times or more the length of the gate length L of the gate electrode of the SOI MOSFET having the minimum gate length. Concretely, in a case where the gate length L of the gate electrode may be about 0.1 to 0.3 μm, the length Lpn of the potential well may be set at about 0.2 to 0.5 μm. Although not especially restricted, the width a (refer to FIG. 1(b) and FIG. 5) of the potential well may preferably be a width capable of compensating the misalignment of the gate electrode in the process of fabrication. By way of example, the width a may be set to be at least about double an alignment margin DM. Concretely, in the case of the gate length L of the gate electrode and the length Lpn of the potential well as mentioned above, the width a may be set at about 0.2 to 0.3 μm. Further, in a case where the potential well has the convex portion on the device isolation region side, the width Wpn (refer to FIG. 1(b)) of the convex portion may be set to be, for example, L<Wpn<Lpn+2DM or so. Concretely, in the case of the gate length L of the gate electrode and the length Lpn and width a of the potential well as mentioned above, the gate width W of the gate electrode may be set to be W<15 μm or so. By the way, in a case where the potential wells exist at both the ends of the channel region, the width Wpn of each of the potential wells may be half of the above value or so. Besides, the width b (refer to FIG. 1(b)) of the potential well may preferably be a width capable of compensating the misalignment as in the foregoing, and it may be set to be b>4DM by way of example. Further, the width c (refer to FIG. 1(b)) of the potential well may be set at about 0.3 to 0.6 μm by way of example.

The first conductivity type impurity concentration of the potential well can be properly adjusted depending upon the threshold voltage, applied voltages etc. of the semiconductor device to be fabricated, and it may be, at least, equal to the impurity concentration of the channel region. Especially, it may preferably be higher than the impurity concentration of the channel region. By way of example, the impurity concentration of the potential well may be set to be, at least, about double the impurity concentration of the channel region, that is, to be about 2 to 10 times the same. Concretely, in a case where the impurity concentration of the channel region lies in the above range, the impurity concentration of the potential well may be set at about $3 \times 10^{16}$ to $3 \times 10^{18}$/cm$^3$. Incidentally, the potential well may be uniform over its whole region or may be partially set at a higher concentration, or it may have a desired concentration gradient. In a case where the potential well is partially set at the higher concentration or has the concentration gradient, a higher-concentration region may preferably be arranged at a position remoter from the channel region, in the potential well.

The potential well may contain an inert element and/or germanium in addition to the first conductivity type impurity. Owing to such an additional impurity, the lifetime of carriers can be shortened, or the bandgap energy of the potential well can be altered to change, for example, an injection efficiency at a source junction. Mentioned as the inert element is an inert gas such as helium, neon or argon. The inert element may be contained in a concentration range of, for example, $10^{16}$ to $10^{18}$ cm$^{-3}$ or so within the potential well, uniformly over the whole potential well or at a higher concentration partially. Besides, the germanium may be contained in a concentration range of, for example, $10^{16}$ to $10^{18}$ cm$^{-3}$ or so within the potential well, uniformly over the whole potential well or at a higher concentration partially.

By the way, in the present invention, the potential well may preferably be in a floating state.

A gate insulating film on the channel region can be formed having a material and a thickness which are effective for an ordinary gate insulating film. The gate electrode can be formed of any of polysilicon; silicides of refractory metals such as W, Ta, Ti and Mo; polycides made of the silicides (for example, MoSi$_2$ and WSI$_2$) and the polysilicon; other metals; etc., to a thickness of about 150 nm to 300 nm. Incidentally, the gate electrode may have a sidewall spacer which is based on an insulating film.

One skilled in the art can manufacture the semiconductor device of SOI structure according to the present invention by combining suitable processes so that the above structures can be realized.

Now, embodiments of the semiconductor device of SOI structure according to the present invention will be described with reference to the drawings.

Embodiment 1

As shown in FIG. 1(a), an SOI MOSFET in this embodiment is fabricated on an SOI substrate which is constructed in such a way that a buried oxide film being about 120 nm thick and a surface silicon layer being about 50 nm thick are stacked on a silicon substrate in the order. A LOCOS film 1 is formed on the surface silicon layer of the SOI substrate so as to define an active region. A gate electrode 2 doped with an N-type impurity is formed on the active region through a gate oxide film being about 7 nm thick, at a gate length L=0.35 $\mu$m. Besides, a source region 3 and a drain region 4 which have the N-type are formed in those parts of the surface silicon layer on both the sides of the gate electrode 2. Incidentally, the surface silicon layer is in a floating state.

Figure 1B:
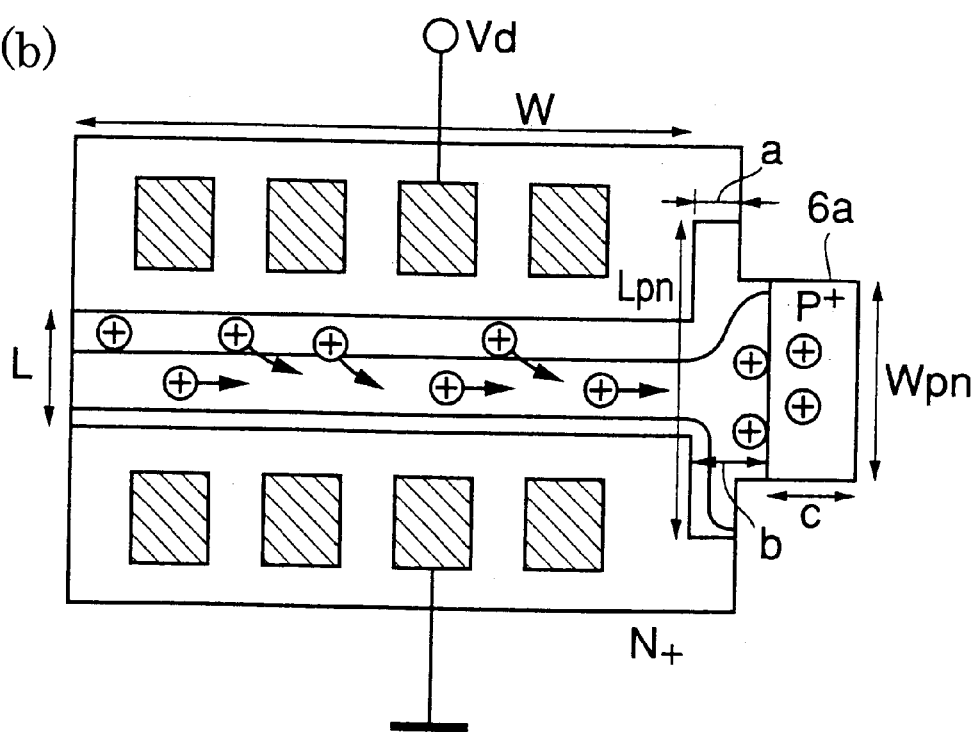

A channel region 5 is formed just under the gate electrode 2, and a potential well 6 is formed just under and around one end of the channel region 5 in the gate width direction thereof (a direction indicated by an arrow in FIG. 1(a)). The potential well 6 has the same impurity concentration of P-type as the impurity concentration (on the order of $10^{17}$/cm$^3$) of the channel region 5, except its partial region 6a which protrudes to the side of the LOCOS film 1 and whose P-type impurity concentration is higher (or is on the order of $10^{19}$/cm$^3$). Referring also to FIG. 1(b), the gate length Lpn of the potential well 6 is about 1.0 $\mu$m, the gate width Wpn thereof is about 0.6 $\mu$m, and the widths a, b and c thereof are about 0.2 $\mu$m, about 0.35 $\mu$m and about 0.5 $\mu$m, respectively.

In an ordinary SOI N-channel MOSFET, electrons generated by impact ionization are attracted to a drain by an electric field, whereas holes are accumulated at a position of lowest potential within a surface silicon layer, for example, in the interface between the surface silicon layer and a buried oxide film or in the vicinity of the junction between a source and the surface silicon layer.

In the N-type SOI MOSFET as in this embodiment, holes generated in the vicinity of a drain junction by impact ionization migrate toward the potential well 6 as indicated in FIG. 1(b). Especially, the region 6a having the higher impurity concentration promotes the action of causing the holes (majority carriers) to migrate toward the potential well 6 because of a lower electrostatic potential. Thus, change in the potential of the surface silicon layer can be suppressed.

Besides, since the potential well 6 exists outside a region essentially functioning as the channel region of the transistor, it can efficiently suppress a back-gate body effect ascribable to accumulated holes. Therefore, the potential well 6 does not affect channel characteristics, for example, it does not change the threshold voltage of the transistor. Moreover, the potential well 6 functions so as to annihilate the holes having migrated, in a short time by recombination.

It is accordingly possible to relieve or suppress a kink effect ascribable to a floating body.

Figure 2A:
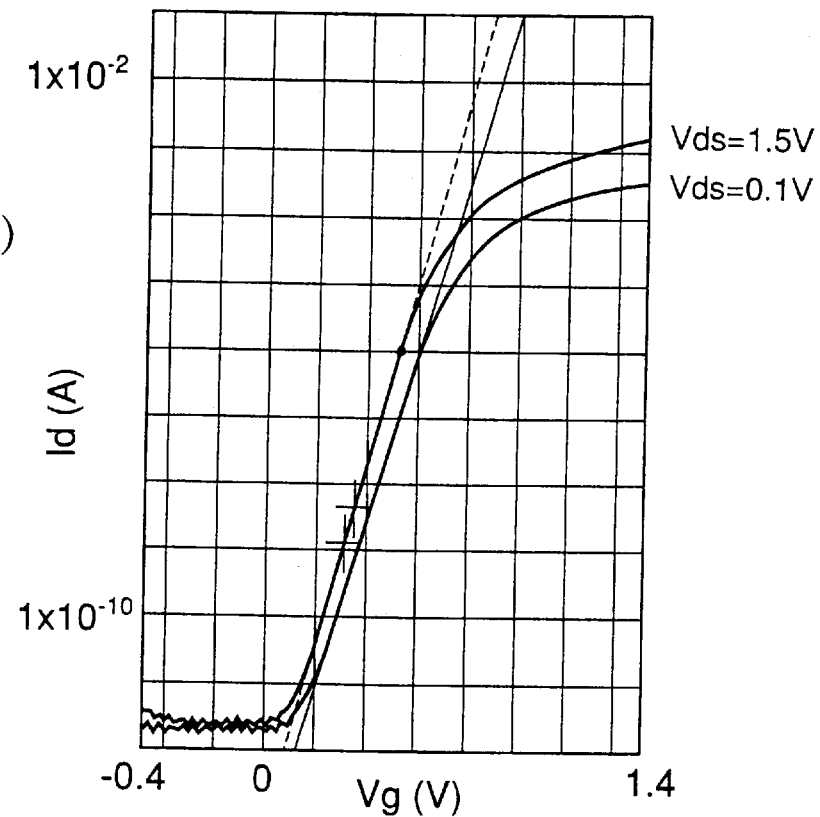
FIGS. 2(*a*) and 2(*b*) are graphs for explaining the characteristics of the semiconductor device shown in FIGS. 1(*a*) and 1(*b*)
Figure 2B:
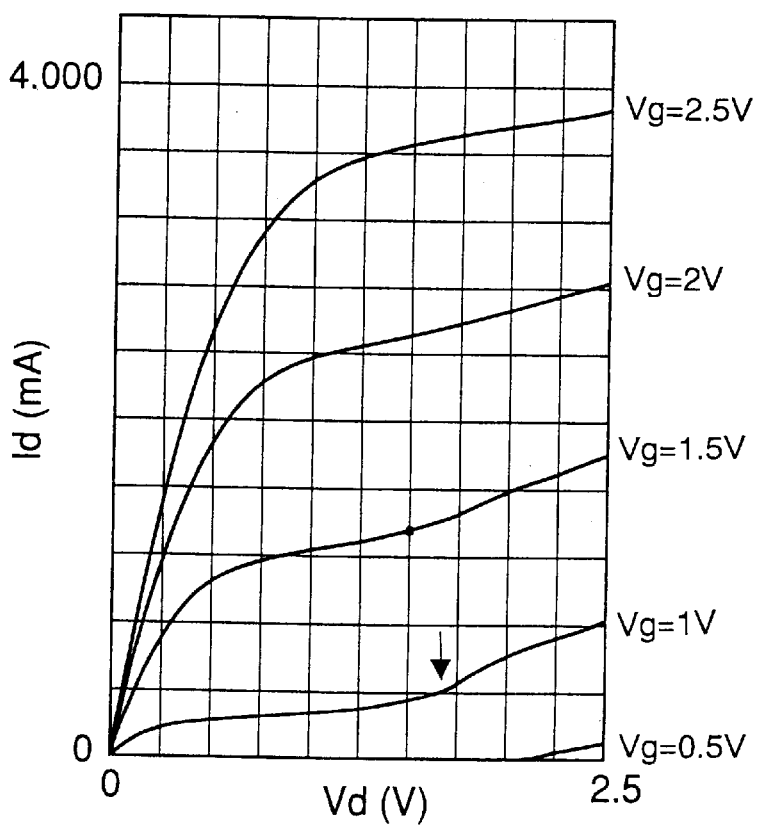

This is understood from the Id–Vg characteristic and Id–Vd characteristic of the SOI MOSFET as shown in FIGS. 2(a) and 2(b), respectively. Incidentally, the potential of the surface silicon layer as well as the source region 3 was set at 0 V during the measurements of these characteristics.

More specifically, as indicated by the experimental I–V characteristics in FIGS. 2(a) and 2(b) for the floating potential well structure, the kink effect starts at a kink starting voltage Vdk of about 1.7 V (the voltage Vdk is as low as about 0.9 V in the prior-art SOI device).

The subthreshold current Id–Vg characteristic in FIG. 2(a) indicates the values of a normal subthreshold swing. That is, the S factor is about 75 mV/dec even at a drain voltage Vds=1.5 V.

In other words, as shown in FIG. 2(a), the SOI MOSFET of the floating potential well structure can suppress the subthreshold kink effect. Although this fact does not decrease the OFF current of the MOSFET at a gate voltage Vg=0 V, it can offer a device of stabler reproducibility. Besides, the kink effect in the Id–Vd characteristic starts at the higher drain voltage Vd.

The above SOI MOSFET can be formed as explained below.

Figure 3A:
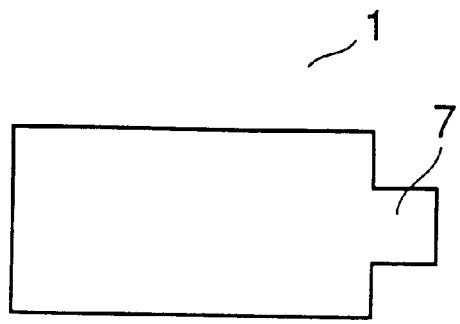
FIGS. 3(*a*) through 3(*d*) are schematic plan processing diagrams of essential portions for explaining a method of manufacturing the semiconductor device shown in FIGS. 1(*a*) and 1(*b*)

First, as shown in FIG. 3(a), a LOCOS film 1 is formed, thereby to define an active region 7. The LOCOS film 1 is formed so as to protrude one end of the active region 7.

Figure 3B:
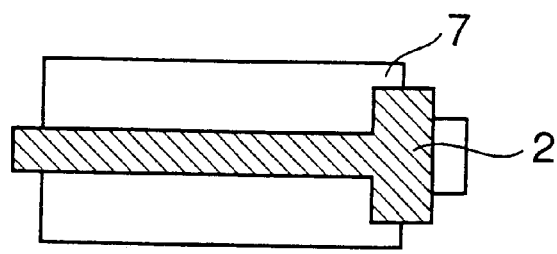

After the P-type impurity concentration of the active region 7 has been adjusted, a gate electrode 2 is formed over the active region 7 as shown in FIG. 3(b). The gate electrode 2 is formed so as to traverse the active region 7 and to overlap the protrusive portion of the active region 7.

Figure 3C:
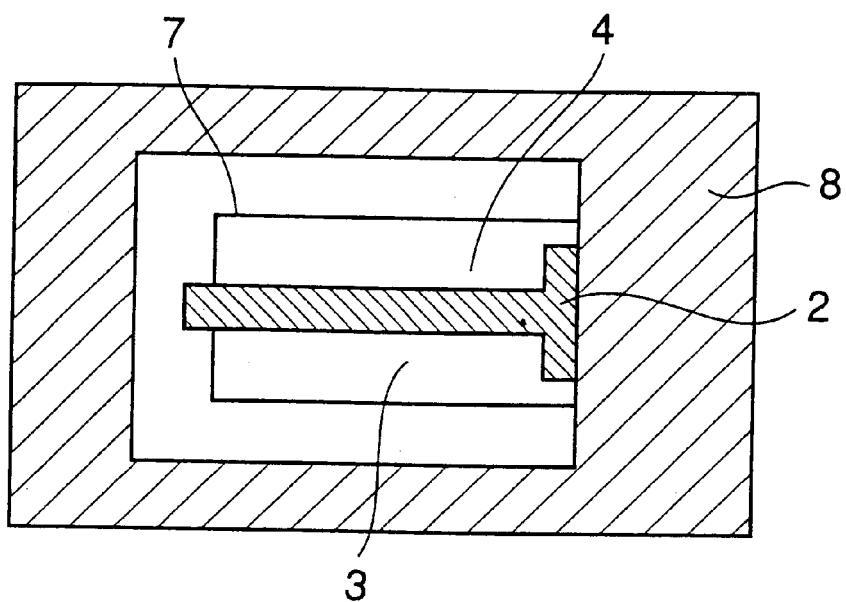

Thereafter, as shown in FIG. 3(c), a resist film 8 which has an opening on the active region 7 except its protrusive portion is formed, and an impurity of N-type, for example, arsenic (As) is ion-implanted at a dose of about 1 to 5×10$^{15}$/cm$^2$ and an energy level of about 30 to 50 keV by employing the resist film 8 and the gate electrode 2 as a mask, thereby to form a source region 3 and a drain region 4.

Figure 3D:
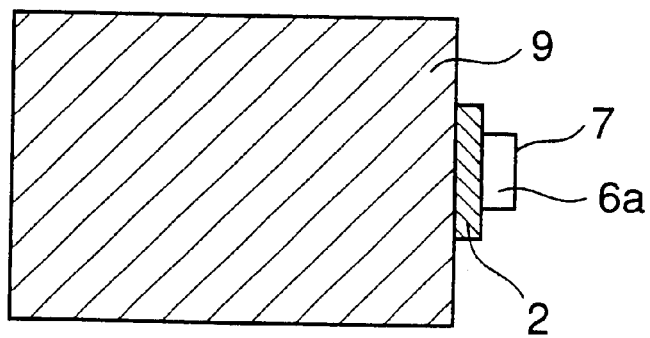

After the removal of the resist film 8, as shown in FIG. 3(d), a resist film 9 which has a pattern reverse to that of the resist film 8 is formed, and an impurity of P-type, for example, boron difluoride (BF$_2$) is ion-implanted at a dose of about 0.4 to 4×10$^{15}$/cm$^2$ and an energy level of about 30 to 40 keV by employing the resist film 9 and a part of the gate electrode 2 as a mask, whereby a region 6a of higher impurity concentration is formed at a part of the protrusive portion of the active region 7. Besides, at the step of the ion implantation, argon (Ar) may be ion-implanted at a dose of about 2×10$^{14}$/cm$^2$. Thus, the lifetime of carriers can be shortened.

Embodiment 2

Figure 4:
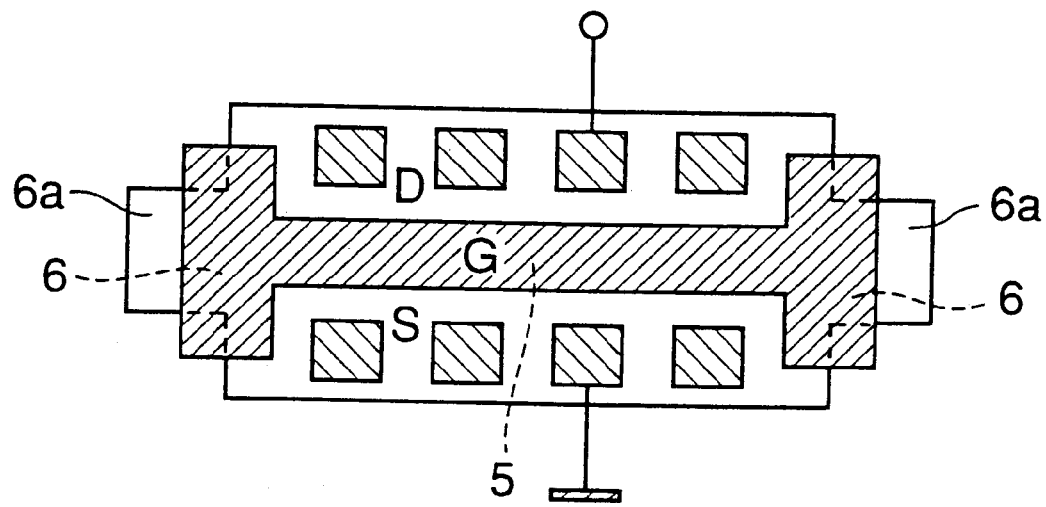
FIG. 4 is a schematic plan view of essential portions showing another embodiment of the semiconductor device of SOI structure according to the present invention.

As shown in FIG. 4, an SOI MOSFET in this embodiment is substantially the same as the SOI MOSFET in Embodiment 1, except that potential wells 6 are formed on both the sides of a channel region 5.

Thus, holes created in the vicinity of a drain junction can be caused to migrate toward both the potential wells 6.

Embodiment 3

Figure 5:
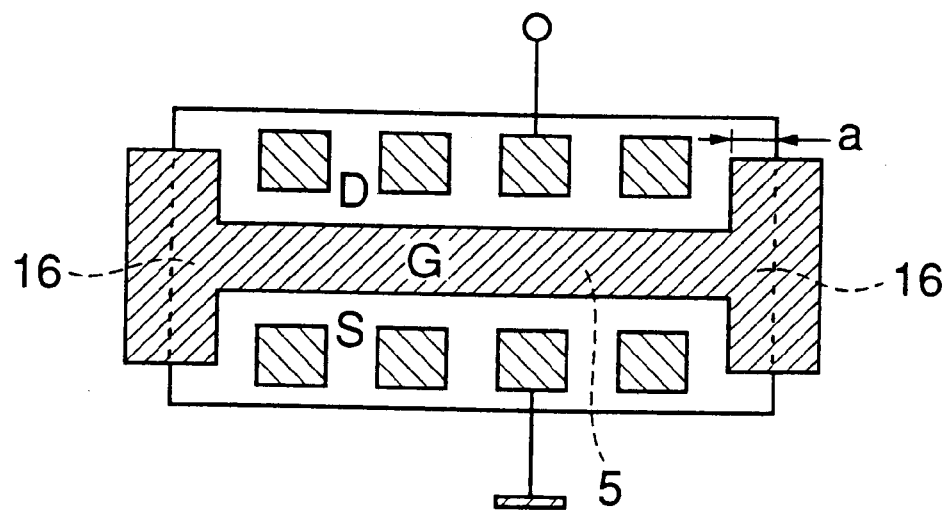
FIG. 5 is a schematic plan view of essential portions showing still another embodiment of the semiconductor device of SOI structure according to the present invention.

As shown in FIG. 5, an SOI MOSFET in this embodiment is substantially the same as the SOI MOSFET in Embodiment 1, except that potential wells 16 are formed just under both the ends of a channel region 5 in the gate width direction thereof, and that any protrusive active region or any region of higher impurity concentration is not included.

Embodiment 4

Figure 6A:
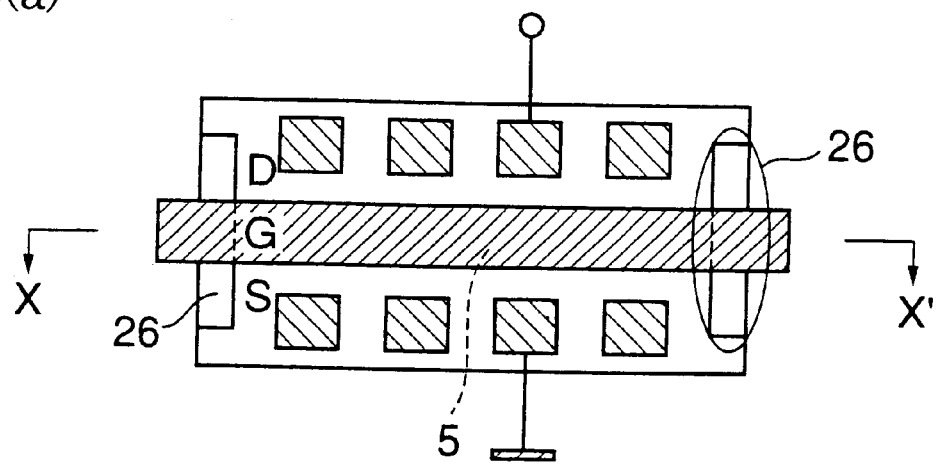
FIG. 6(*a*) is a schematic plan view of essential portions showing yet another embodiment of the semiconductor device of SOI structure according to the present invention, while FIG. 6(*b*) is a sectional view taken along line X–X' indicated in FIG. 6(*a*)
Figure 6B:
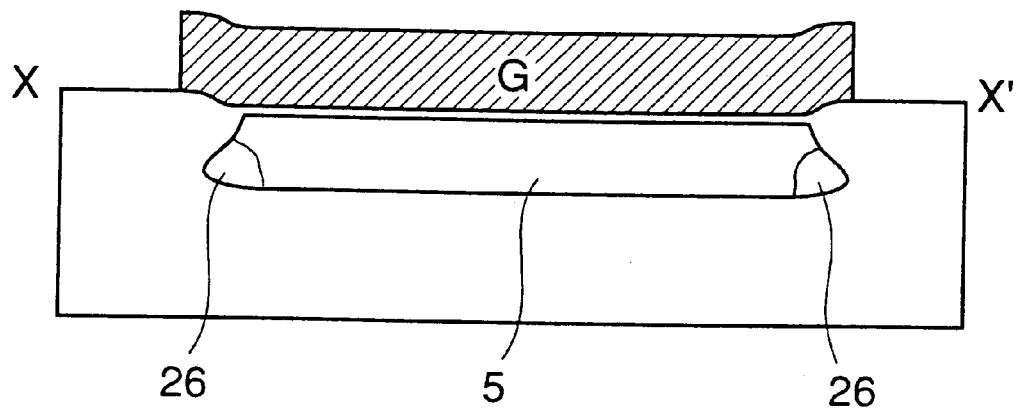
Figure 7A:
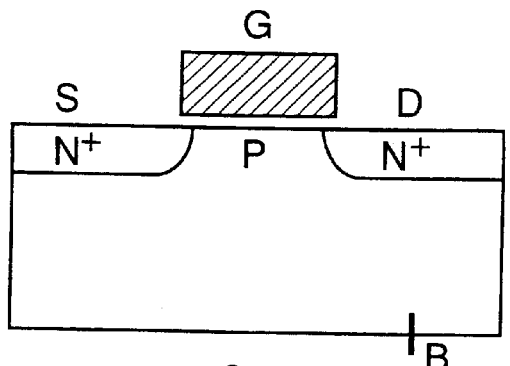
FIG. 7(*a*) is a sectional view of a bulk semiconductor device in the prior art, while FIG. 7(*b*) is an equivalent circuit diagram thereof.
Figure 7B:
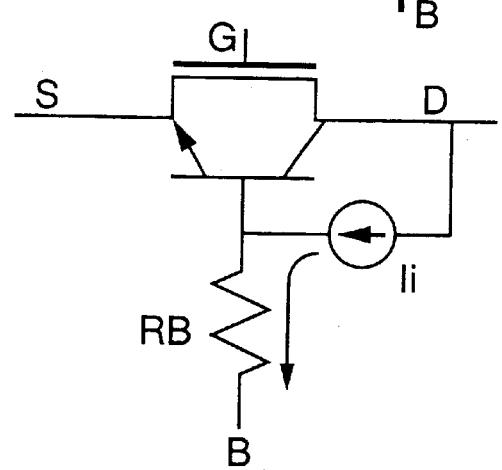
Figure 8A:
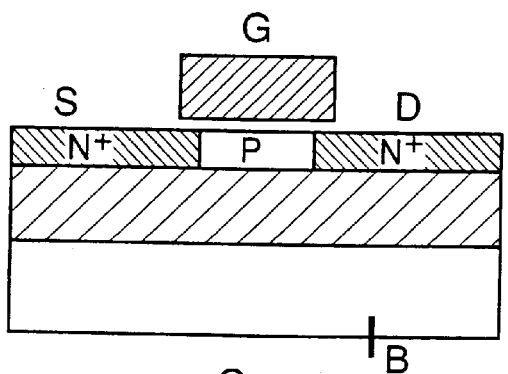
FIG. 8(*a*) is a sectional view of a common semiconductor device of SOI structure in the prior art, while FIG. 8(*b*) is an equivalent circuit diagram thereof.
Figure 8B:
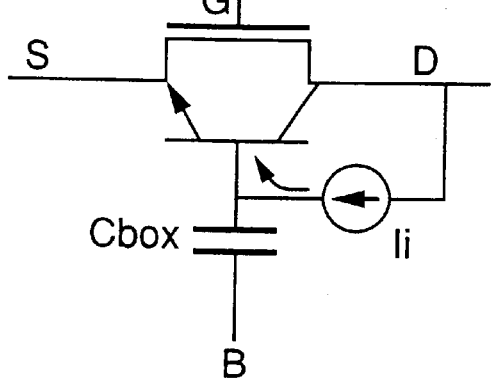
Figure 9A:
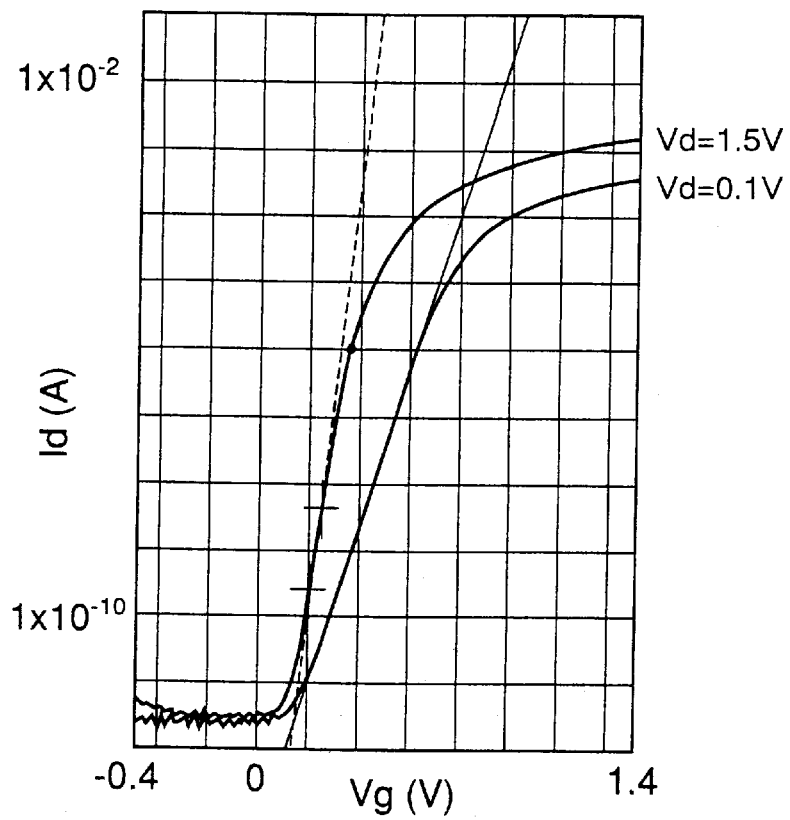
FIGS. 9(*a*) and 9(*b*) are graphs for explaining the characteristics of the semiconductor device of the SOI structure shown in FIGS. 8(*a*) and 8(*b*)
Figure 9B:
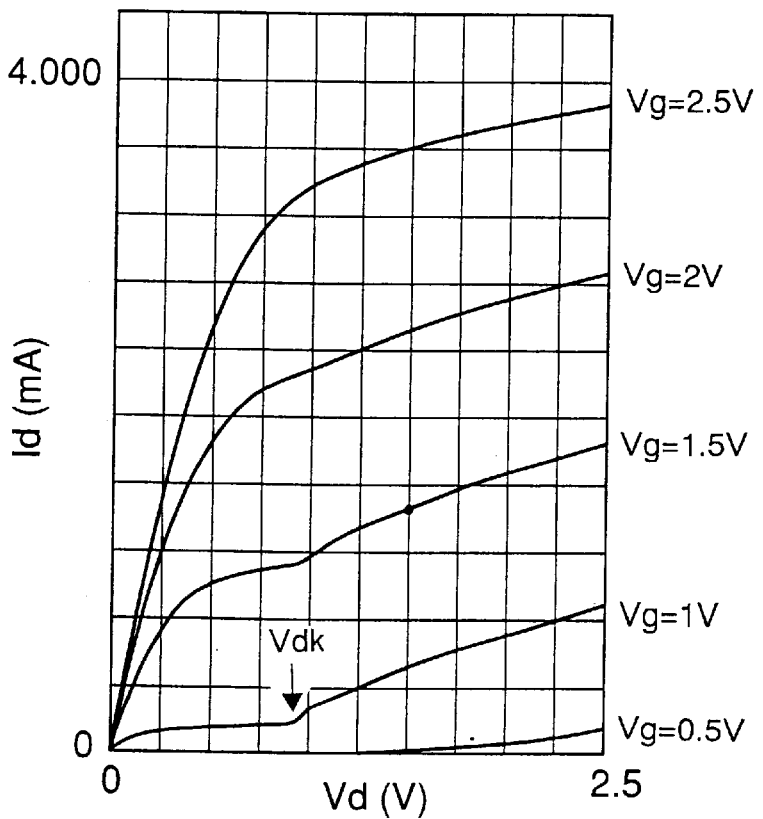
Figure 10:
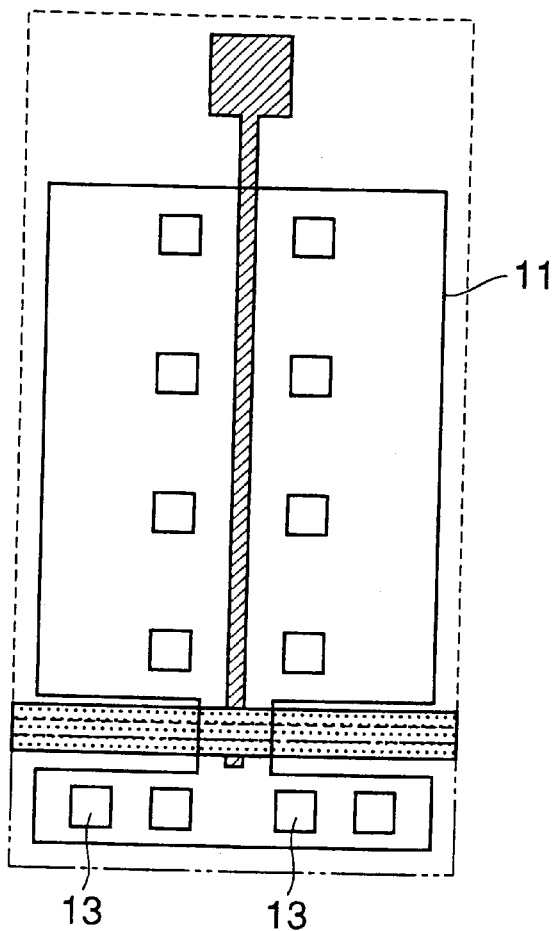
FIG. 10 is a schematic plan view of essential portions showing another prior-art semiconductor device of SOI structure.
Figure 11:
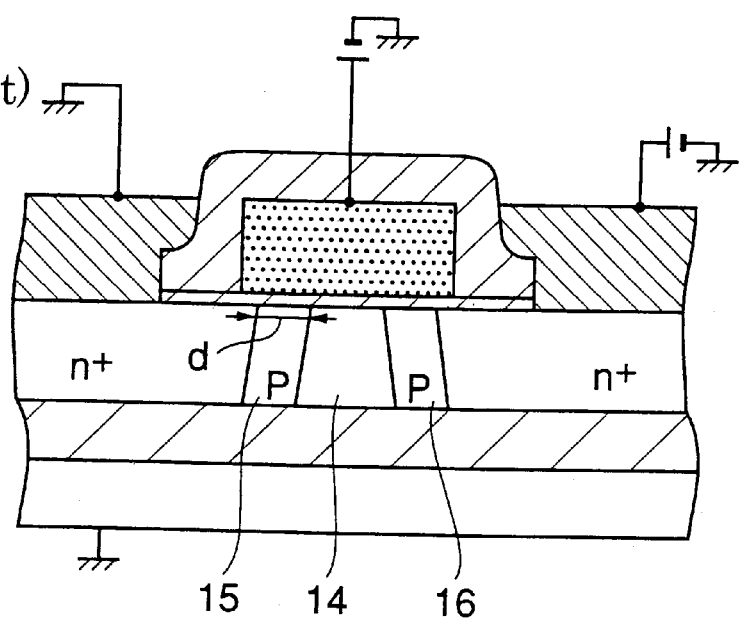
FIGS. 11 to 14 are schematic sectional views of essential portions showing still another prior-art semiconductor device of SOI structure, respectively.
Figure 12:
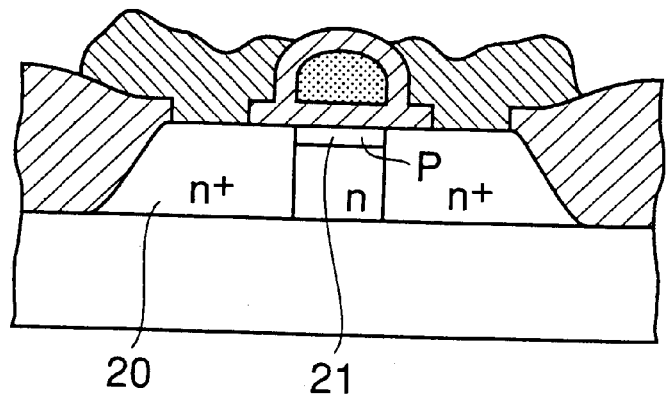
Figure 13:
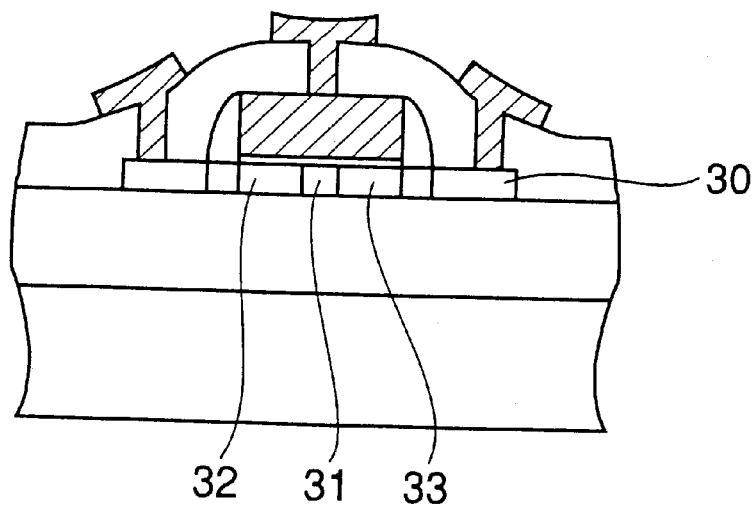
Figure 14:
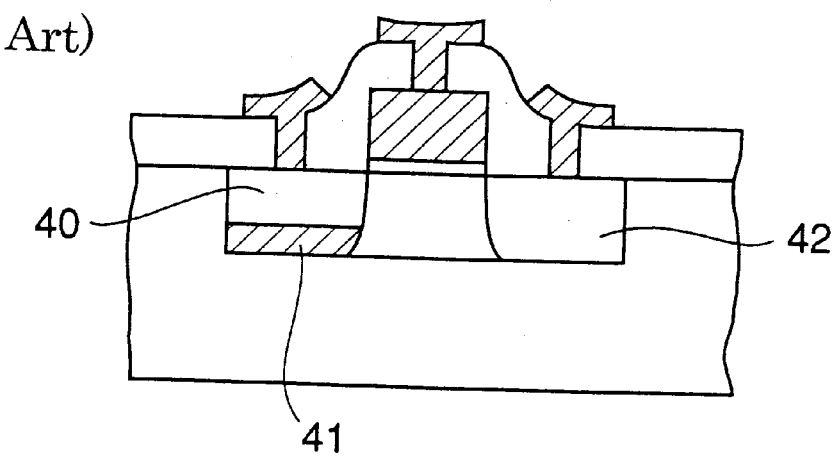

As shown in FIGS. 6(a) and 6(b), an SOI MOSFET in this embodiment is substantially the same as the SOI MOSFET in Embodiment 1, except that potential wells 26 which have an impurity concentration (on the order of $10^{18}/cm^3$) higher than the impurity concentration (on the order of $10^{17}/cm^3$) of a channel region 5 are formed just under and around both the ends of the channel region 5 in the gate width direction thereof, and that any region being substantially the same as the channel region 5 in the impurity concentration or any protrusive active region is not included.

This SOI MOSFET can be fabricated in such a way that, after the formation of a LOCOS film and before the formation of a gate electrode, the potential wells 26 are formed by ion-implanting an impurity of P-type through a resist mask which has an opening on parts of the ends of an active region.

The present invention thus far described can bring forth various beneficial effects as stated below.

According to the present invention, in a semiconductor device of SOI structure, a potential well of first conductivity type is formed at and/or near at least one end of a channel region in the gate width direction thereof, whereby the semiconductor device can include a fully depleted or partially depleted channel, and majority carriers generated by impact ionization can be efficiently collected and annihilated without changing a threshold voltage due to a back-gate substrate effect. Thus, a kink effect in the subthreshold region of the semiconductor device of SOI structure can be efficiently reduced, and the kink starting voltage of a drain voltage can be increased.

Therefore, it is permitted to realize stabler I–V characteristics and to decrease fluctuation in the current of an OFF state. Also, an available percentage can be enhanced owing to lowerings in the fluctuation of characteristics, and in turn, an inexpensive semiconductor device of SOI structure can be offered owing to curtailment in a manufacturing cost. Moreover, the features are advantageous for an analog transistor operation of which the improvement of a gain is required. In other words, a voltage range in which the transistor can be stably operated is widened more, and the transistor can be operated at a lower voltage.

Especially in a case where the potential well has an impurity concentration higher than that of the channel region, or where the potential well is longer than the gate length in the gate length direction thereof, majority carriers created by impact ionization can be collected and annihilated more efficiently, and the kink effect in the subthreshold region can be reduced more efficiently.

Moreover, in a case where the potential well further contains an inert element as an impurity, the majority carriers can be annihilated by recombination in a short time, and the lifetime of carriers can be shortened more. Besides, in a case where germanium is further contained as an impurity, the bandgap energy of the potential well can be altered, so that the holes can be caused to migrate to the potential well more efficiently.

In a case where the potential well having the impurity concentration higher than that of the channel region is formed in self-alignment with a gate electrode, the simplification of a manufacturing process can be attained to curtail a manufacturing cost and consequently offer an inexpensive semiconductor device.

Further, in a case where the potential well is set in an electrically floating state, any contact led to a surface semiconductor layer or the potential well need not especially be formed, and hence, an occupation area can be decreased to realize a higher density of integration. Since the formation of the contact can be dispensed with, it is possible to simplify a manufacturing process and consequently curtail a manufacturing cost. Moreover, the grades of AC characteristics etc. can be prevented from lowering, and a semiconductor device of high reliability can be obtained.

What is claimed is:

1. A semiconductor device including SOI structure, the semiconductor device comprising:

a surface semiconductor layer in a floating state, which is stacked on a buried insulating film so as to form an SOI substrate, source/drain regions of second conductivity type which are formed in the surface semiconductor layer, a channel region of first conductivity type between the source/drain regions, a gate electrode formed over the channel region and a gate insulating film, wherein the surface semiconductor layer comprises only a single potential well of the first conductivity type formed therein at and/or near only one end of the channel region in a gate width direction thereof and wherein a first part of the potential well includes an impurity concentration higher than that of the channel region so as to cause majority carriers to migrate toward the potential well, and wherein a second part of the potential well not having an impurity concentration higher than that of the channel region has a length (Lpn) that is longer than a length (Wpn) of the first part of the potential well that has an impurity concentration higher than that of the channel region.

2. A semiconductor device as defined in claim 1, wherein the potential well is formed in self-alignment with the gate electrode.

3. A semiconductor device as defined in claim 1, wherein the potential well is formed near ends of the source/drain regions and between the source/drain regions.

4. A semiconductor device as defined in claim 1, wherein the potential well has a length Lpn which does not cause a short channel effect incurring a potential fall in the gate length direction.

5. A semiconductor device as defined in claim 4, wherein the potential well is longer than a gate length of the gate electrode in a gate length direction.

6. A semiconductor device as defined in claim 5, wherein the potential well has 1.5 times or more the length of the gate length L of the gate electrode.

7. A semiconductor device as defined in claim 1, wherein the potential well is set in an electrically floating state.

8. A semiconductor device as defined in claim 1, wherein the potential well further contains an inert element and/or germanium as an impurity.

9. A semiconductor device as defined in claim 1, wherein the inert element and/or germanium is contained in a concentration range of $10^{16}$ to $10^{18}$ $cm^{-3}$, respectively.

10. A semiconductor device as defined in claim 1, wherein the source/drain regions are so deep as to reach the buried oxide film.

11. A semiconductor device as defined in claim 1, wherein the potential well is so deep as to reach the buried oxide film.

12. A semiconductor device as defined in claim 1, wherein the potential well has an impurity concentration in a range of $3\times10^{16}$ to $10^{18}$ cm$^{-3}$.

13. A semiconductor device comprising:

a SOI (Silicon-On-Insulator) substrate including a surface semiconductor layer in a floating state, a channel region located between source and drain regions formed in the surface semiconductor layer, wherein the channel region is of a first conductivity type and the source/drain regions are of a second conductivity type different than the first conductivity type;

a gate electrode formed over the channel region; and wherein the surface semiconductor layer further comprises only one potential well of the first conductivity type formed therein at or near only one end of the channel region, and wherein only a first part of the potential well includes an impurity concentration higher than that of the channel region so as to cause holes or majority carriers to migrate toward the potential well, and wherein the first part of the potential well has a length (Wpn) less than a length (Lpn) of the potential well.

14. The semiconductor device of claim 1, wherein the first part of the potential well has an impurity concentration from 2–10 times higher than the channel region.

15. The semiconductor device of claim 13, wherein the first part of the potential well has an impurity concentration from 2–10 times higher than the channel region.

* * * * *